(12) United States Patent
Miyagi et al.

(10) Patent No.: US 9,875,154 B2
(45) Date of Patent: Jan. 23, 2018

(54) NON-VOLATILE SEMICONDUCTOR STORAGE DEVICE AND METHOD OF TESTING THE SAME

(71) Applicant: Seiko Instruments Inc., Chiba-shi, Chiba (JP)

(72) Inventors: Masanori Miyagi, Chiba (JP); Taro Yamasaki, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 230 days.

(21) Appl. No.: 14/789,168

(22) Filed: Jul. 1, 2015

(65) Prior Publication Data

US 2015/0301889 A1 Oct. 22, 2015
US 2017/0017543 A9 Jan. 19, 2017

Related U.S. Application Data

(63) Continuation of application No. PCT/JP2013/078650, filed on Oct. 23, 2013.

(30) Foreign Application Priority Data

Jan. 9, 2013 (JP) .................. 2013-002083

(51) Int. Cl.
*G06F 11/10* (2006.01)
*G11C 29/42* (2006.01)
*G11C 29/36* (2006.01)
*G11C 29/52* (2006.01)

(52) U.S. Cl.
CPC ...... *G06F 11/1068* (2013.01); *G06F 11/1048* (2013.01); *G11C 29/36* (2013.01); *G11C 29/42* (2013.01); *G11C 29/52* (2013.01)

(58) Field of Classification Search
CPC .. G06F 11/1068; G06F 11/1048; G11C 29/52; G11C 29/36; G11C 29/42
See application file for complete search history.

(56) References Cited

U.S. PATENT DOCUMENTS 5,424,989 A 6/1995 Hagiwara et al.
5,745,673 A * 4/1998 Di Zenzo ............ G06F 11/1008
365/201

(Continued)

FOREIGN PATENT DOCUMENTS

EP 0 917 059 A1 5/1999
JP 62-214599 A 9/1987

(Continued)

OTHER PUBLICATIONS

International Search Report in corresponding International Application No. PCT/JP2013/078650, dated Dec. 10, 2013, 2 pages.

(Continued)

*Primary Examiner* — Cynthia Britt
(74) *Attorney, Agent, or Firm* — Brinks Gilson & Lione

(57) ABSTRACT

Provided is a non-volatile semiconductor storage device which can be downsized with a simple circuit without impairing the function of an error correcting section, and a method of testing the non-volatile semiconductor storage device. An error correction circuit is configured to perform error detection and correction of merely the same number of bits as data bits, and a circuit for performing error detection and correction of check bits is omitted to downsize the circuit. A multiplexer for, in a testing state, replacing a part of the data bits read out from a storage element array with the check bits, and inputting the check bits to the error correction circuit is provided. Thus, error detection and correction of the check bits are performed to enable shipment inspection concerning the check bits as well.

5 Claims, 7 Drawing Sheets

(56) References Cited

U.S. PATENT DOCUMENTS

| | | | |
|---|---|---|---|
| 7,559,004 B1* | 7/2009 | Chang | H03M 13/11 714/708 |
| 2001/0003510 A1 | 6/2001 | Kasai et al. | |
| 2004/0125676 A1 | 7/2004 | Osada et al. | |
| 2005/0229077 A1 | 10/2005 | Takahashi | |
| 2006/0028853 A1 | 2/2006 | Osada et al. | |
| 2006/0133166 A1 | 6/2006 | Kikutake et al. | |
| 2006/0156214 A1 | 7/2006 | Kikutake et al. | |
| 2008/0016392 A1 | 1/2008 | Earl et al. | |
| 2008/0094869 A1 | 4/2008 | Osada et al. | |
| 2009/0094504 A1 | 4/2009 | Sadakata et al. | |
| 2011/0066918 A1* | 3/2011 | Ramaraju | G06F 11/1012 714/757 |
| 2012/0266033 A1 | 10/2012 | Gold et al. | |

FOREIGN PATENT DOCUMENTS

| | | |
|---|---|---|
| JP | 6-68700 A | 3/1994 |
| JP | 11-242899 A | 9/1999 |
| JP | 2001-23394 A | 1/2001 |
| JP | 2001-167596 A | 6/2001 |
| JP | 2004-213719 A | 7/2004 |
| JP | 2005-327437 A | 11/2005 |
| JP | 2006-179056 A | 7/2006 |
| JP | 2009-93714 A | 4/2009 |
| JP | 4704078 B2 | 6/2011 |

OTHER PUBLICATIONS

Extended European Search Report in corresponding European Application No. 13871272.4, dated Sep. 22, 2016, 8 pages.

* cited by examiner

NON-VOLATILE SEMICONDUCTOR STORAGE DEVICE AND METHOD OF TESTING THE SAME

RELATED APPLICATIONS

The present application is a continuation application of PCT/JP2013/078650, filed Oct. 23, 2013, the entire contents of which are incorporated herein by reference.

BACKGROUND OF THE INVENTION

1. Field of the Invention

The present invention relates to a non-volatile semiconductor storage device and a shipment test therefor, and more specifically, to a test circuit and method used for a characteristic test of a non-volatile storage element in a non-volatile semiconductor storage device having an ECC circuit mounted thereon.

2. Description of the Related Art

A related art non-volatile semiconductor storage device having an ECC circuit mounted thereon is described. FIG. 8 is a circuit diagram illustrating the related art non-volatile semiconductor storage device having the ECC circuit mounted thereon.

The related art non-volatile semiconductor storage device having the ECC circuit mounted thereon includes an ECC encoder 81, a data cell array 82, a check bit cell array 83, a syndrome decoder 84, and an error correcting section 85.

At the time of data writing, the related art non-volatile semiconductor storage device operates as follows. The data cell array 82 receives and stores write data WD. The ECC encoder 81 receives the write data WD to generate an error correcting code (ECC) corresponding to the write data WD, and outputs the error correcting code to the check bit cell array 83. The check bit cell array 83 receives and stores the error correcting code.

At the time of data read-out, the related art non-volatile semiconductor storage device operates as follows. The syndrome decoder 84 performs error detection with use of the write data WD of the data cell array 82 and the error correcting code of the check bit cell array 83 to generate syndrome data, and outputs the syndrome data to the error correcting section 85. The error correcting section 85 corrects the error with use of the write data WD, the error correcting code, and the syndrome data, and outputs read data RD (for example, see Japanese Patent Application Laid-open No. 2001-23394).

However, the related art semiconductor storage device having the ECC circuit mounted thereon includes a circuit for performing error detection and error correction of the write data WD and the error correcting code in the error correcting section 85, and hence has a problem in that the circuit scale is large.

In normal data read-out, only error correction of the write data WD is required, and error detection and error correction of the error correcting code are unnecessary. However, in shipment inspection, error detection of the error correcting code is required, that is, initial failure of the check bit cell array is required to be detected.

SUMMARY OF THE INVENTION

The present invention has been made in view of the above-mentioned problem, and provides a non-volatile semiconductor storage device which can be downsized with a simple circuit without impairing the function of an error correcting section, and to a method of testing the non-volatile semiconductor storage device.

In order to solve the conventional problem, according to one embodiment of the present invention, in a non-volatile semiconductor storage device having an ECC circuit mounted thereon, an error correction circuit is configured to perform error detection and correction of merely the same number of bits as data bits, and a circuit for performing error detection and correction of check bits is omitted to downsize the circuit. Then, a multiplexer for, in a testing state, replacing a part of the data bits read out from a storage element array with the check bits, and inputting the check bits to the error correction circuit is provided. Thus, the error detection and correction of the check bits are performed to enable shipment inspection concerning the check bits as well.

According to the present invention, it is possible to provide the non-volatile semiconductor storage device which can be downsized with a simple circuit without impairing the function of the error correcting section, and to the method of testing the non-volatile semiconductor storage device.

DETAILED DESCRIPTION OF THE PREFERRED EMBODIMENTS

Figure 1:
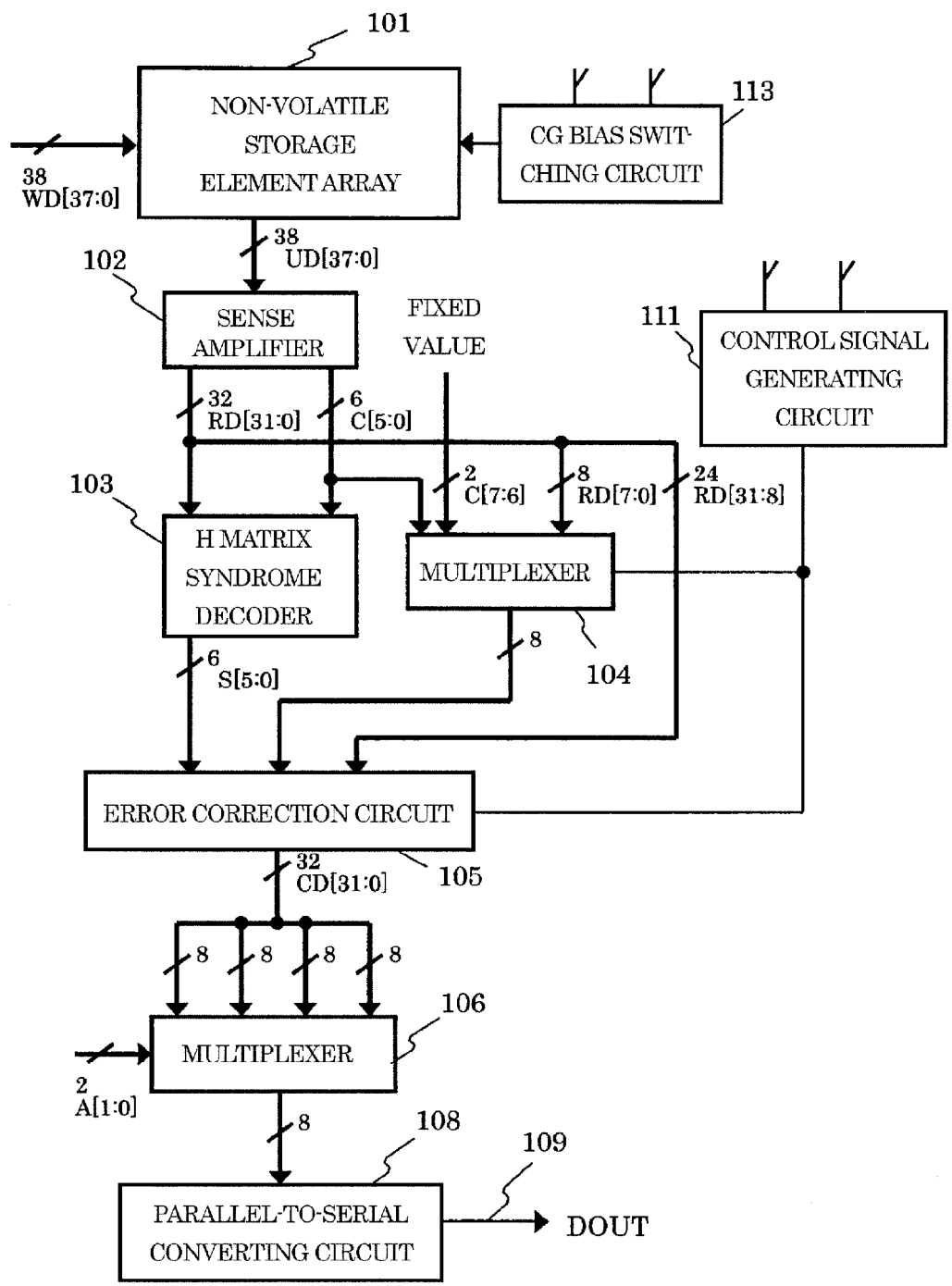
FIG. 1 is a structural diagram of a non-volatile semiconductor storage device having an ECC circuit mounted thereon according to a first embodiment of the present invention.

In the following, embodiments of the present invention are described with reference to the drawings.

An error correction circuit 105 of a non-volatile semiconductor storage device having an ECC circuit mounted thereon according to the present invention is configured to perform error detection and correction of merely 32 data bits RD[31:0]. That is, the error correction circuit 105 is downsized by omitting a circuit for performing error detection and correction of 6 check bits C[5:0].

Further, there is provided a multiplexer for, in a testing state, replacing a part of the data bits read out from a storage element array with the check bits, and inputting the check bits to the data error correction circuit. Thus, the error detection and correction of the check bits are performed to enable the shipment inspection concerning the check bits as well.

At this time, in a non-volatile storage element array 101, in a case of data whose all of the data bits RD[31:0] are 0, data whose all of the check bits C[5:0] are also 0 is written. In a case of data whose all of the data bits RD[31:0] are 1, data whose all of the check bits C[5:0] are also 1 is written. Those data may be achieved by a circuit for generating the check bits C[5:0], which is included in a writing circuit, or may be input from the outside.

First Embodiment

FIG. 1 illustrates a structure of a non-volatile semiconductor storage device having an ECC circuit mounted thereon according to a first embodiment of the present invention.

The non-volatile semiconductor storage device having the ECC circuit mounted thereon according to the first embodiment includes the non-volatile storage element array 101, a control gate (CG) bias switching circuit 113, a sense amplifier 102, an H matrix syndrome decoder 103, multiplexers 104 and 106, a control signal generating circuit 111, the error correction circuit 105, a parallel-to-serial converting circuit 108, and a DOUT terminal 109.

The CG bias switching circuit 113 outputs one of a normal CG bias, which is generated therein, and a CG bias voltage for testing, which is input from outside, in a switching manner. The control signal generating circuit 111 outputs control signals to the multiplexer 104 and the error correction circuit 105 in accordance with an input state signal.

In the non-volatile storage element array 101, a plurality of units are arranged in an array, the plurality of units each including, as a basic unit, one unit made up of an m-data-bit storage element for storing write data WD and an n-check-bit storage element for storing an error correction code. In this embodiment, as an example, description is made of a case where the write data WD is 38-bit write data WD[37:0] including 32 data bits and 6 check bits.

In the non-volatile semiconductor storage device having the ECC circuit mounted thereon of this embodiment, a circuit for performing writing to a storage element array is omitted.

Figure 6:
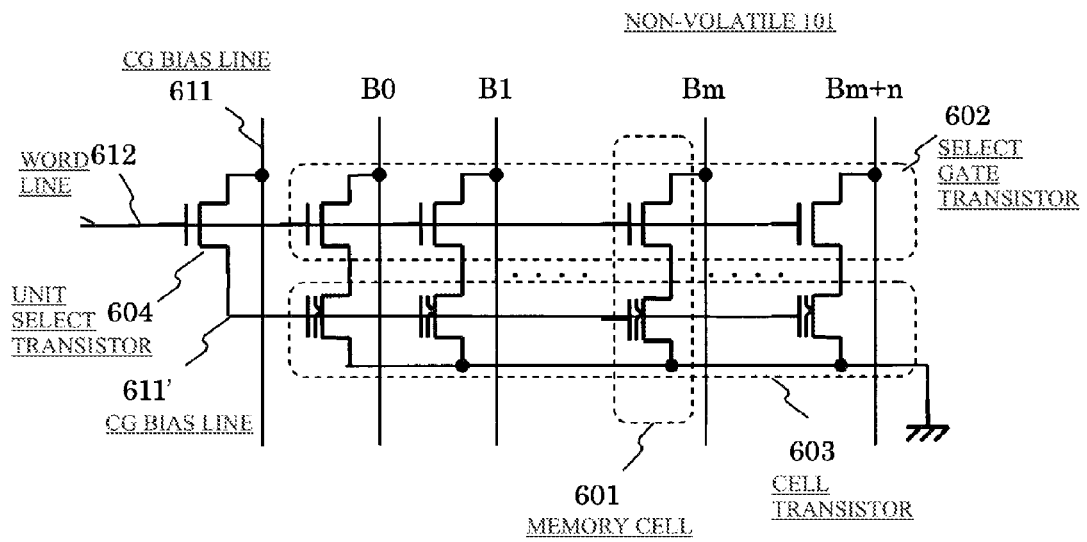
FIG. 6 is a structural diagram of one unit of a non-volatile storage element according to the present invention.

FIG. 6 is a circuit diagram illustrating a structural example of one unit in the non-volatile storage element array 101 constructed of FLOTOX-type non-volatile memories.

One unit in the non-volatile storage element array 101 includes m+n select gate transistors 602, m+n cell transistors 603, and a unit select transistor 604. Bit lines B0 to Bm+n are connected to drains of the respective corresponding select gate transistors 602. A CG bias line 611 is connected to a drain of the unit select transistor 604, and is connected to, via a source of thereof, gates of the cell transistors 603 (CG bias line 611'). A word line 612 is connected to gate electrodes of the select gate transistors 602 and a gate electrode of the unit select transistor 604. A memory cell 601 includes the select gate transistor 602 and the cell transistor 603 that are connected in series to each of the bit lines B.

Figure 7:
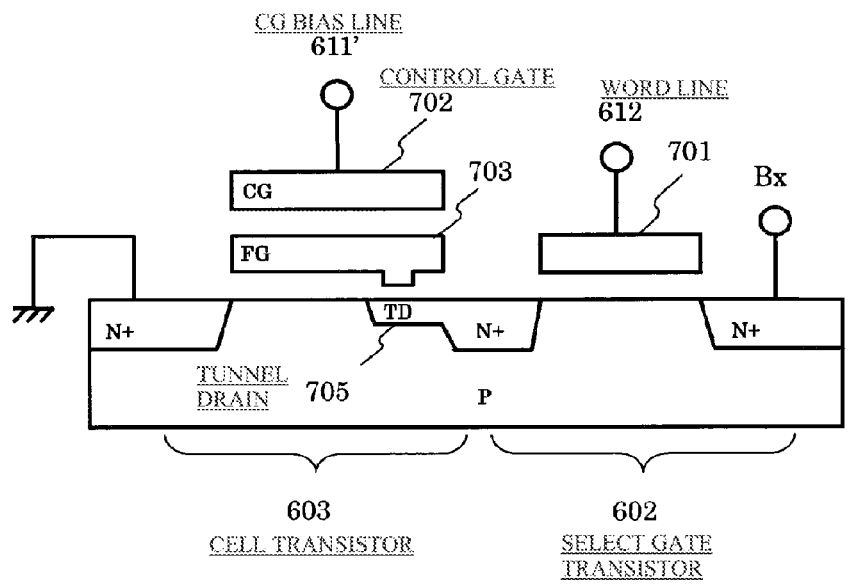
FIG. 7 is a schematic sectional view of a FLOTOX type non-volatile memory as an example of the non-volatile storage element according to the present invention.
Figure 8:
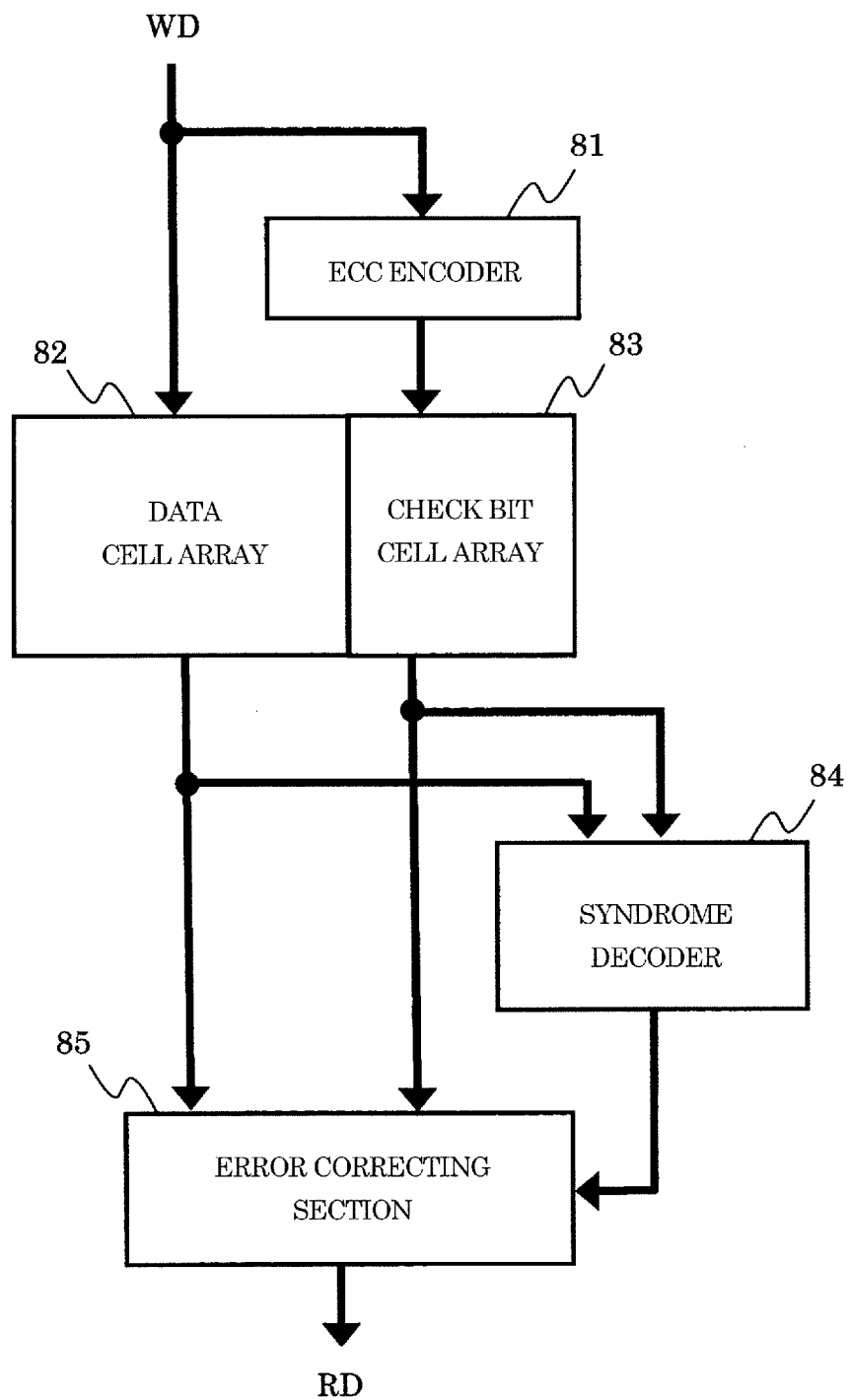
FIG. 8 is a structural diagram of a related art non-volatile semiconductor storage device having an ECC circuit mounted thereon.

FIG. 7 is a sectional view of the FLOTOX type non-volatile memory (cell transistor 603 and select gate transistor 602). An electric field is applied between a control gate 702 and a tunnel drain 705 to inject or extract changes into or from a floating gate 703. In this manner, writing and erasing of data can be performed.

The non-volatile memory can read out data as follows. A positive voltage is applied to the word line 612 to turn on the unit select transistor 604. A positive voltage is also applied to a gate 701 of the select gate transistor 602, and hence the select gate transistor 602 is turned on. A CG bias is applied to the control gate 702 of the cell transistor 603 via the unit select transistor 604. Under this state, whether or not a current flows from the bit line B to a ground terminal, or the magnitude of the current is detected by the sense amplifier circuit, to thereby determine the data of the memory cell.

Next, the operation of the non-volatile semiconductor storage device having the ECC circuit mounted thereon of the first embodiment is described.

First, the normal data read-out operation is described.

The CG bias switching circuit 113 selects a normal CG bias among the input CG biases, and supplies the normal CG bias to the non-volatile storage element array 101.

The sense amplifier 102 reads out 38-bit read-out data UD[37:0] from the memory cell of one unit in the non-volatile storage element array 101. The 38-bit read-out data UD[37:0] is divided into 32 data bits RD[31:0] and 6 check bits C[5:0]. The H matrix syndrome decoder 103 receives the data bits RD[31:0] and the check bits C[5:0] to generate 6-bit syndrome data S[5:0]. The H matrix syndrome decoder 103 operates as an error correction code generating circuit.

The multiplexer 104 selects data bits RD[7:0] and sends the selected data bits RD[7:0] to the error correction circuit 105. Then, the error correction circuit 105 corrects, based on data bits RD[31:8] input from the sense amplifier 102, the data bits RD[7:0], and the syndrome data S[5:0], an error of 1 bit among the 32 data bits RD[31:0], and outputs collect data CD[31:0].

The collect data CD[31:0] output from the error correction circuit 105 is selected by the multiplexer 106 for every 8 bits in accordance with the last 2 bits A[1:0] of address data, and the selected data is sent to the parallel-to-serial converting circuit 108 as read data. Further, the read data is transferred and output by the parallel-to-serial converting circuit 108 to the DOUT terminal 109 serially one bit by one bit in synchronization with a clock.

Next, the data read-out operation during the testing mode is described.

In a failure bit number determining mode of the testing mode, it is determined whether the number of the failure bits is 1 or less or 2 or more. The control signal generating circuit 111 outputs control signals to the multiplexer 104 and the error correction circuit 105 in accordance with the input state signal.

First, as a first state, the control signal generating circuit 111 sets the multiplexer 104 and the error correction circuit 105 so that data flows in a similar way to that during the normal read-out operation. Then, under a state in which 1 or 0 is written to all of the data items of one unit, the collect data CD[31:0] is read out.

If all of the data items of the read-out collect data CD[31:0] is 1 or 0, it can be determined that the 32 data bits RD[31:0] have an error or 1 bit or less.

Next, as a second state, the multiplexer 104 and the error correction circuit 105 are controlled by the control signals of the control signal generating circuit 111 as follows. The multiplexer 104 sends 2-bit fixed values C[7:6] and 6 check bits C[5:0] to the error correction circuit 105 as check bits. As for the 2-bit fixed values C[7:6], (1, 1) is selected when all of the data items written to the one unit is 1, and (0, 0) is selected when all of the data items written to the one unit is 0. The error correction circuit 105 changes the combination of calculation between the syndrome data S[5:0] and data to be subjected to error correction. That is, the error correction circuit 105 sets 32 bits including the data bits RD[31:8], the fixed bits C[7:6], and the check bits C[5:0] as the data to be subjected to error correction.

The sense amplifier 102 reads out 38-bit read-out data UD[37:0] from the memory cell of one unit in the non-volatile storage element array 101. The 38-bit read-out data UD[37:0] is divided into 32 data bits RD[31:0] and 6 check bits C[5:0]. The H matrix syndrome decoder 103 receives the data bits RD[31:0] and the check bits C[5:0] to generate 6-bit syndrome data S[5:0].

The multiplexer 104 selects the 2-bit fixed values C[7:6] and the 6 check bits C[5:0] and sends the 2-bit fixed values C[7:6] and the 6 check bits C[5:0] to the error correction circuit 105. Then, the error correction circuit 105 corrects, based on data bits RD[31:8] input from the sense amplifier 102, the 2-bit fixed values C[7:6], the 6 check bits C[5:0], and the syndrome data S[5:0], an error of 1 bit among the 32 bits thereof, and outputs collect data CD[31:0].

When all of the data items of the read-out collect data CD[31:0] are 1 or 0, it can be determined that 32 bits including the data bits RD[31:8], the 2-bit fixed values C[7:6], and the 6 check bits C[5:0] have an error of 1 bit or less.

Therefore, in the second state, it is possible to check whether the 32 bits including the 6 check bits C[5:0] have an error of 1 bit or less.

In the testing method as described above, when read-out is performed while selecting, by the CG bias switching circuit 113, a CG bias voltage for testing that is input from the outside, and applying the CG bias voltage for testing to the non-volatile storage element array 101, it is possible to determine whether the number of bits of the memory cell not reaching a predetermined threshold voltage is 1 bit or less or 2 bits or more.

Note that, an example of a case where "m=32, n=6" is set as a structure of one unit is disclosed, but the combination of the numerical values of m and n is not limited thereto, and the testing may be similarly performed no matter what combination is used. Further, the FLOTOX type non-volatile storage element is described as an example, but the present invention is not limited to this structure as long as a non-volatile storage element is used.

As described above, the non-volatile semiconductor storage device of this embodiment can be downsized with a simple circuit without impairing the function of the error correcting section.

Second Embodiment

Figure 2:
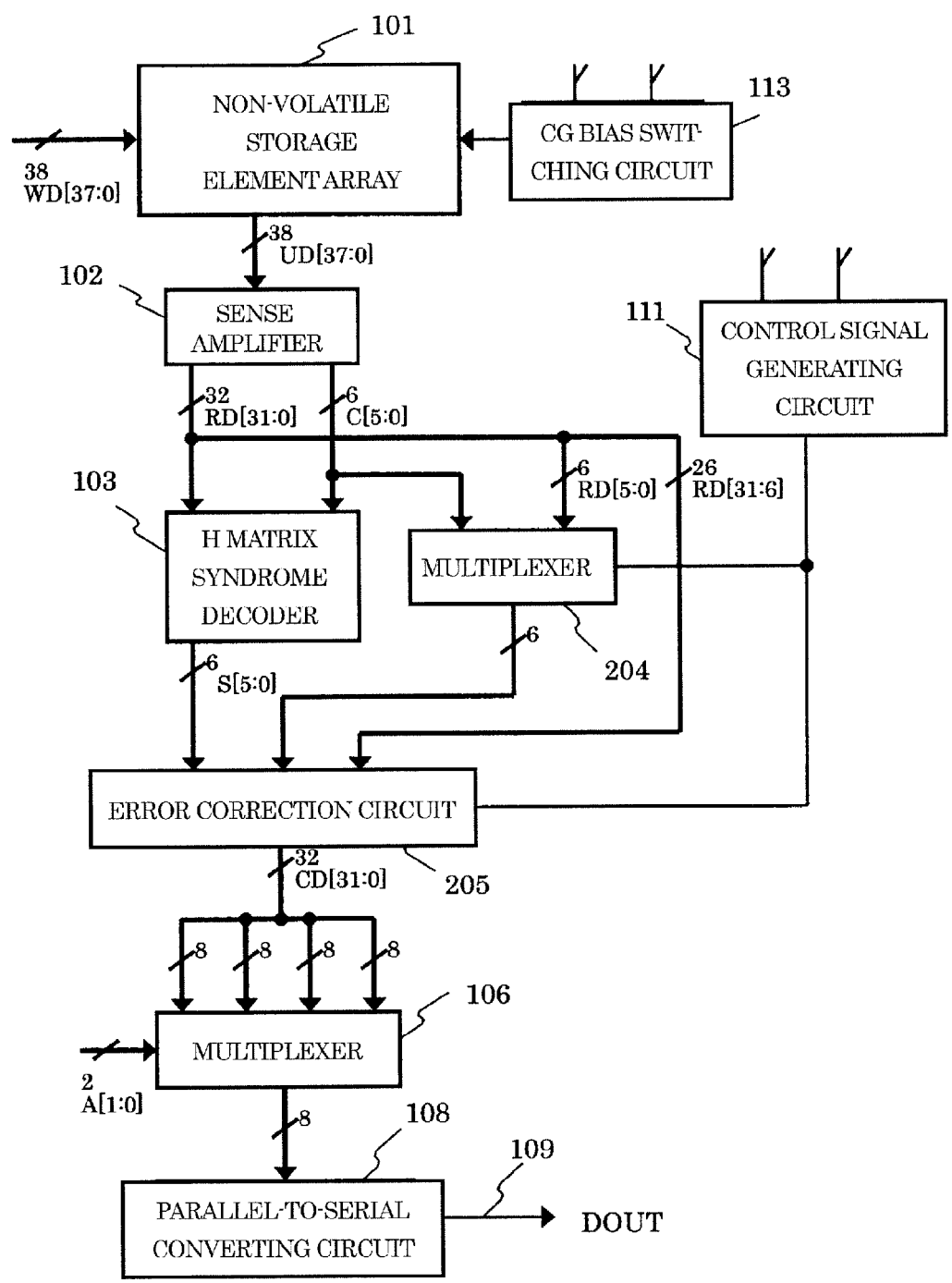
FIG. 2 is a structural diagram of a non-volatile semiconductor storage device having an ECC circuit mounted thereon according to a second embodiment of the present invention.

FIG. 2 illustrates a structure of a non-volatile semiconductor storage device having an ECC circuit mounted thereon according to a second embodiment of the present invention.

The difference from the first embodiment resides in that the 2-bit fixed values C[7:6] are eliminated. Therefore, a multiplexer 204 is configured to select data bits RD[5:0] in the first state, and select the check bits C[5:0] in the second state. Then, an error correction circuit 205 performs error detection and correction of data of 32 bits in total, including data bits RD[31:6] and 6 bits output from the multiplexer 204.

With such a structure, it is possible to eliminate a circuit for selecting and outputting the 2-bit fixed values C[7:6], and hence the circuit can be further downsized.

Third Embodiment

Figure 3:
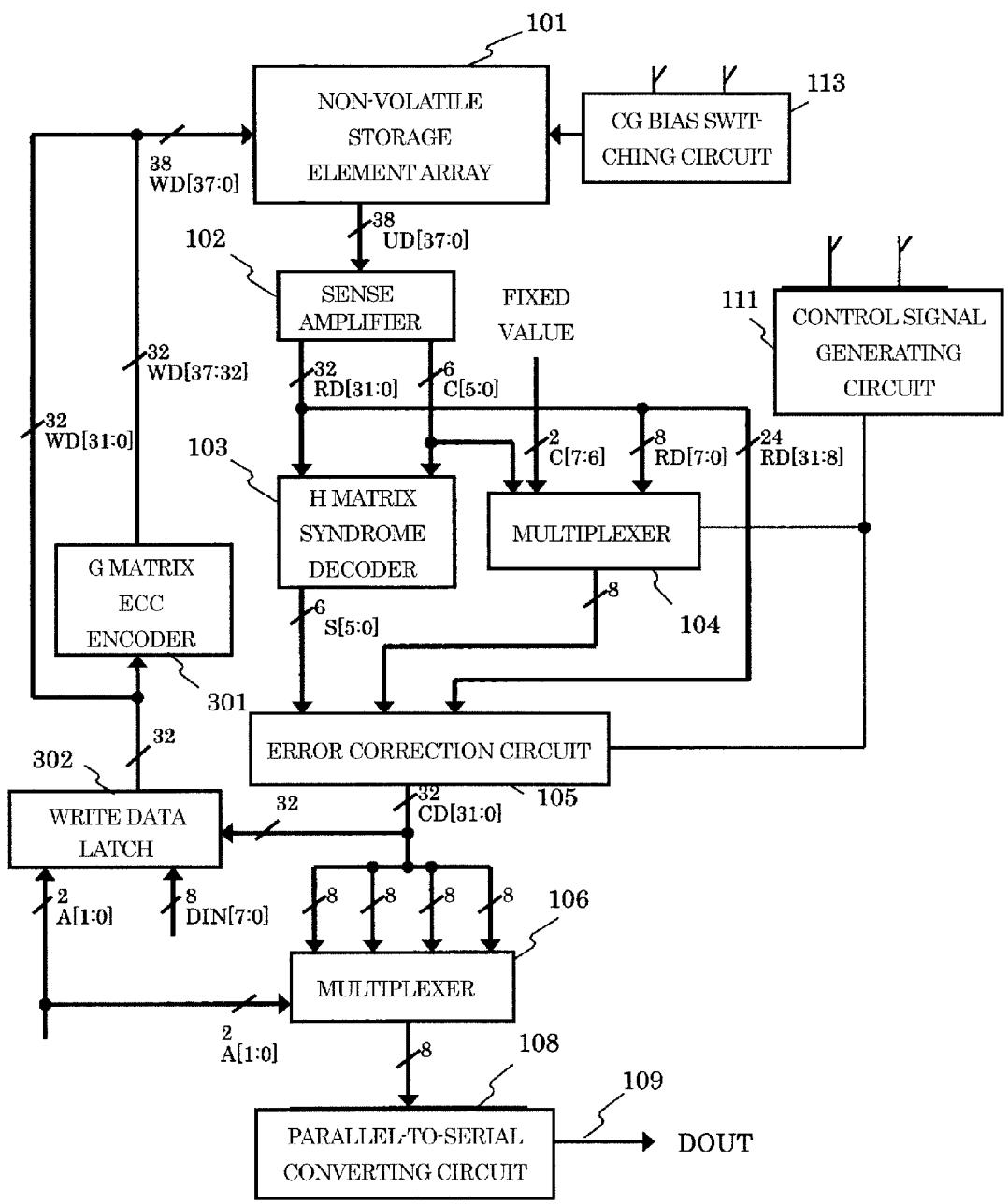
FIG. 3 is a structural diagram of a non-volatile semiconductor storage device having an ECC circuit mounted thereon according to a third embodiment of the present invention.

FIG. 3 illustrates a structure of a non-volatile semiconductor storage device having an ECC circuit mounted thereon according to a third embodiment of the present invention.

The difference from the first embodiment resides in that a G matrix ECC encoder 301 and a write data latch 302 are added as a data writing passage with respect to the non-volatile storage element array 101. The H matrix syndrome decoder 103 and the G matrix ECC encoder 301 operate as the error correction code generating circuit.

When writing data to the non-volatile storage element array 101, one unit of data including a designated address is read out once, and the collect data CD[31:0] subjected to error correction is stored in the write data latch 302 once. This is referred to as read back operation. Next, 8-bit data DIN[7:0] corresponding to writing data of the designated address is sent to the write data latch 302 for replacement with the collect data CD[31:0].

In response to the input of 32 data bits WD[31:0], the G matrix ECC encoder 301 outputs 6 check bits WD[37:32]. In this case, the G matrix ECC encoder 301 is configured so that the output check bits WD[37:32] are all 0 when the data bits WD[31:0] are all 0, and the output check bits WD[37:32] are all 1 when the data bits WD[31:0] are all 1.

Finally, the data of the write data latch 302 is rewritten to the non-volatile storage element array 101 as 38 data bits WD[37:0] including the 32 data bits WD[31:0] and the check bits WD[37:32]. The method of determining the number of failure bits in one unit is similar to that in the first embodiment.

Thus, as described in the first embodiment, the non-volatile semiconductor storage device of this embodiment can be downsized with a simple circuit without impairing the function of the error correcting section.

Fourth Embodiment

Figure 4:
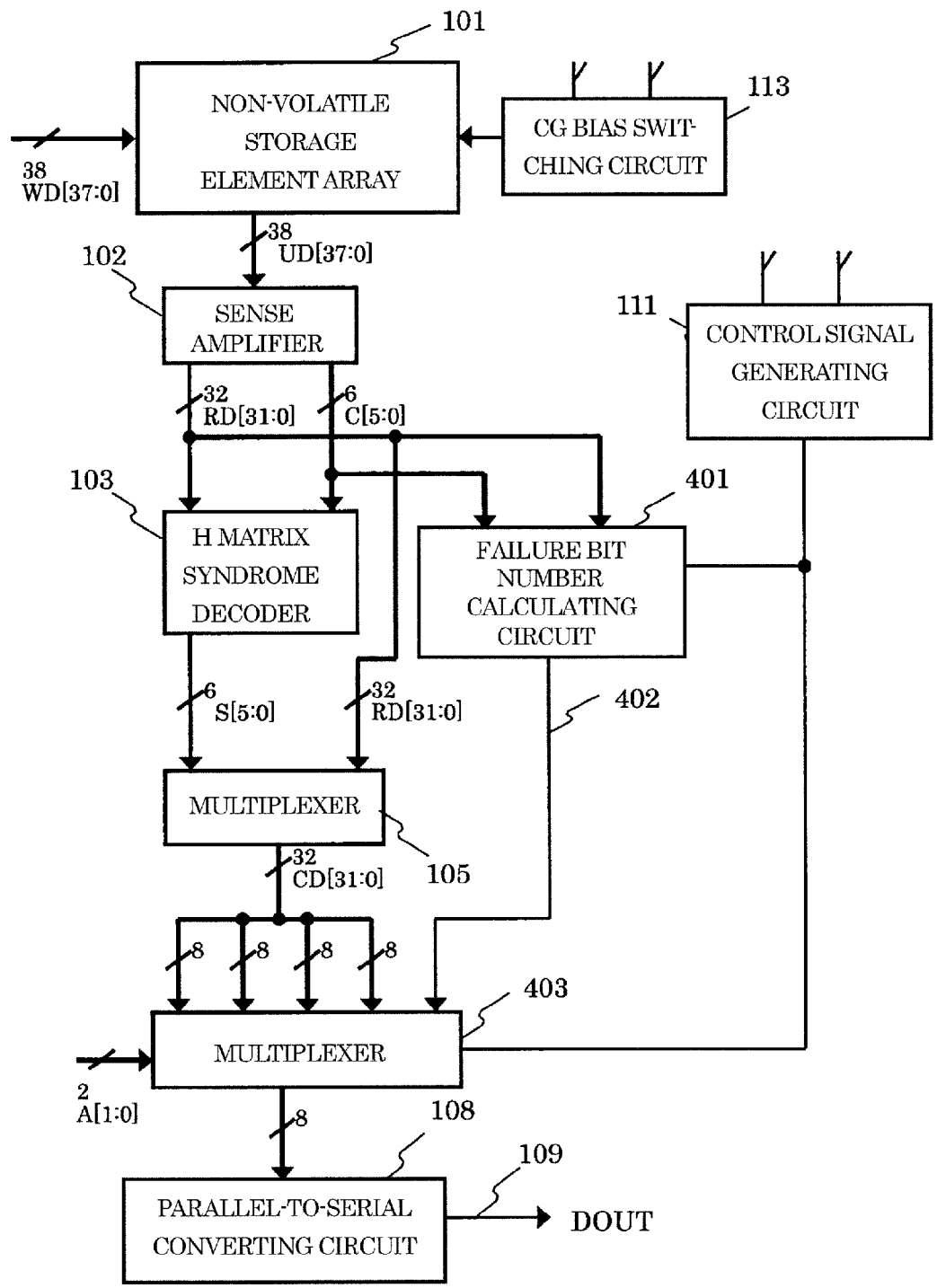
FIG. 4 is a structural diagram of a non-volatile semiconductor storage device having an ECC circuit mounted thereon according to a fourth embodiment of the present invention.

FIG. 4 illustrates a structure of a non-volatile semiconductor storage device having an ECC circuit mounted thereon according to a fourth embodiment of the present invention. The difference from the first embodiment resides in that the multiplexer 104 is changed to a failure bit number calculating circuit 401.

When the failure bit number calculating circuit 401 detects that, for example, under a state in which data 1 is written to all of the bits of one unit in the non-volatile storage element array 101, the data bits RD[31:0] and the check bits C[5:0] have data 0 of 2 bits or more as a result of the read-out operation, the failure bit number calculating circuit 401 sends a failure unit detection flag 402 to a multiplexer 403.

Further, when the failure bit number calculating circuit 401 detects that, under a state in which data 0 is written to all of the bits of one unit in the non-volatile storage element array 101, the data bits RD[31:0] and the check bits C[5:0] have data 1 of 2 bits or more as a result of the read-out operation, the failure bit number calculating circuit 401 sends the failure unit detection flag 402 to the multiplexer 403.

As described above, the failure unit detection flag 402 is read out from the DOUT terminal 109 via the multiplexer 403 and the parallel-to-serial converting circuit 108, and thus whether the product is non-defective or defective can be easily determined.

Therefore, the non-volatile semiconductor storage device of this embodiment can be downsized with a simple circuit without impairing the function of the error correcting section.

Fifth Embodiment

Figure 5:
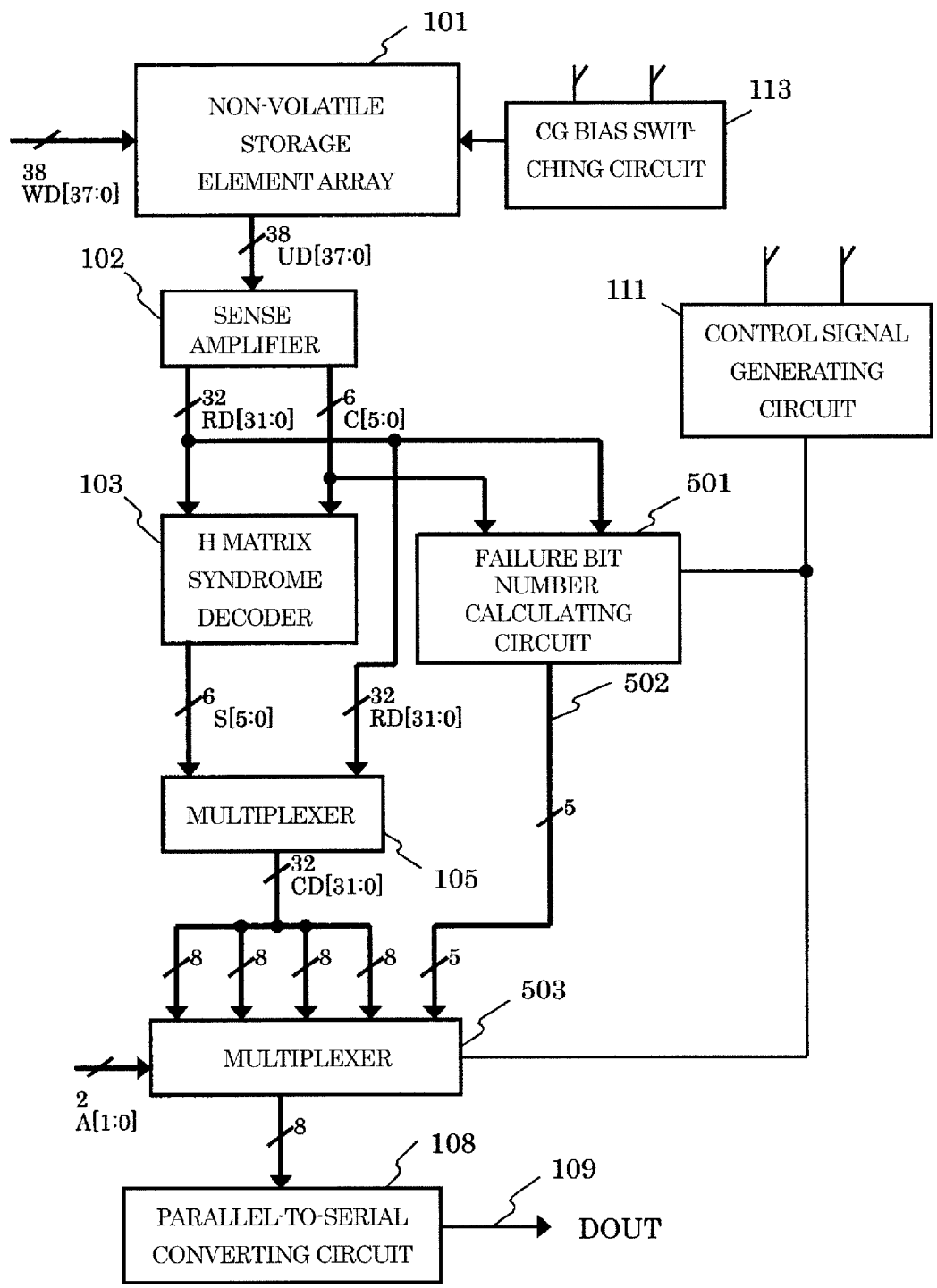
FIG. 5 is a structural diagram of a non-volatile semiconductor storage device having an ECC circuit mounted thereon according to a fifth embodiment of the present invention.

FIG. 5 illustrates a structure of a non-volatile semiconductor storage device having an ECC circuit mounted thereon according to a fifth embodiment of the present invention.

The difference from the first embodiment resides in that the multiplexer 104 is changed to a failure bit number calculating circuit 501.

The failure bit number calculating circuit 501 determines whether the number of failure bits of the data bits RD[31:0] is 1 bit or less or 2 bits or more in 1 byte unit for every 8 bits, and also independently calculates the number of failure bits in the check bits C[5:0]. As a result, 5 bits of failure unit detection flags 502 in total are sent to the multiplexer 503.

Whether 5 bits of failure unit detection flags 502 are all 0 indicating non-detection or at least one of them is 1 indicating detection is read out from the DOUT terminal 109 via the multiplexer 503 and the parallel-to-serial converting circuit 108. In this manner, whether the product is non-defective or defective can be easily determined. Then, with use of a CG bias from the outside, the CG bias switching circuit 113 performs a similar operation, and thus whether the number of bits of the memory cell not reaching a predetermined threshold voltage is 1 bit or less or 2 bits or more can be determined.

What is claimed is:

1. A non-volatile semiconductor storage device, comprising:
    a non-volatile semiconductor storage element array for storing data bits and check bits, the non-volatile semiconductor storage element array comprising one unit including an m-data-bit storage element and an n-check-bit storage element which forms a basic unit;
    an error correction code generating circuit for generating an error correction code based on the data bits and the check bits of the one unit read out from the non-volatile semiconductor storage element array;
    a control signal generating circuit for outputting a control signal for switching between a normal mode and a test mode;
    a multiplexer for selecting between normal mode data and test mode data based on the control signal to output selected one of the normal mode data and the test mode data, wherein the test mode data comprises a total of m bits of data including n check bits, 2 fixed bits and a predetermined number of data bits corresponding to a number of m-(n+2); and
    an error correction circuit for performing error correction on inputted m data bits based on the error correction code, wherein the error correction circuit corrects, in the test mode, the total of m bits of data including the n check bits.

2. A non-volatile semiconductor storage device according to claim 1, wherein in the test mode, the error correction code corresponds to the test mode data.

3. A non-volatile semiconductor storage device according to claim 1, further comprising a control gate (CG) bias switching circuit,
    wherein the control gate (CG) bias switching circuit applies, to the non-volatile semiconductor storage element array, a normal bias voltage, or alternatively, an inspection bias voltage.

4. A method of testing a non-volatile semiconductor storage device, the method comprising:
    writing, in a non-volatile semiconductor storage element array for storing m data bits and n check bits, one of 0 and 1 to all of the data bits and the check bits;
    reading out the m data bits and the n check bits from the non-volatile semiconductor storage element array;
    generating, by an error correction code generating circuit, an error correction code based on the m data bits and the n check bits;
    switching, by a multiplexer, between normal mode data and test mode data, the test mode data having m bits of data including the n check bits,
    outputting, by the multiplexer, corresponding one of the test mode data and the normal mode data; and
    performing, by an error correction circuit, error correction using the test mode data which includes the n check bits, 2 fixed bits and a predetermined number of data bits corresponding to a number of m-(n+2).

5. A method of testing a non-volatile semiconductor storage device according to claim 4, further comprising applying, by a control gate (CG) bias switching circuit, a normal bias voltage, or alternatively, an inspection bias voltage to the non-volatile semiconductor storage element array.

* * * * *